United States Patent
Kim

(10) Patent No.: US 7,592,670 B2
(45) Date of Patent: Sep. 22, 2009

(54) SEMICONDUCTOR DEVICE

(75) Inventor: Dong-Sun Kim, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 233 days.

(21) Appl. No.: 11/528,592

(22) Filed: Sep. 28, 2006

(65) Prior Publication Data

US 2007/0069280 A1    Mar. 29, 2007

(30) Foreign Application Priority Data

Sep. 29, 2005    (KR) .................... 10-2005-0091693

(51) Int. Cl.
*H01L 29/786* (2006.01)
(52) U.S. Cl. ............................... 257/347; 257/E21.442
(58) Field of Classification Search ................. 257/347, 257/E21.442
See application file for complete search history.

(56) References Cited

U.S. PATENT DOCUMENTS

| | | | |
|---|---|---|---|
| 6,413,802 B1 * | 7/2002 | Hu et al. ..................... | 438/151 |
| 7,368,355 B2 * | 5/2008 | Bernstein et al. ............ | 438/284 |
| 2004/0108545 A1 | 6/2004 | Ando ......................... | 257/329 |
| 2006/0244066 A1 * | 11/2006 | Yeo et al. .................... | 257/347 |

OTHER PUBLICATIONS

B. Doris, et al., "A Simplified Hybrid Orientation Technology (SHOT) for High Performance CMOS", 2004 Symposium on VLSI Technology Digest of Technical Papers, pp. 86-87.

* cited by examiner

*Primary Examiner*—Kenneth A Parker
*Assistant Examiner*—Paul A Budd
(74) *Attorney, Agent, or Firm*—Morgan Lewis & Bockius LLP

(57) ABSTRACT

A semiconductor device includes a P-channel metal-oxide semiconductor (PMOS) transistor and an N-channel metal-oxide semiconductor (NMOS) transistor formed in three or more fin active regions in a vertical stack structure, an input metal line contacting gates of the PMOS transistor and NMOS transistor, a power supply voltage metal line contacting four channel active regions of the PMOS transistor, a contact metal line contacting two channel active regions of the NMOS transistor, and an output metal line contacting four channel active regions of the PMOS transistor and the NMOS transistor.

8 Claims, 9 Drawing Sheets

US 7,592,670 B2

SEMICONDUCTOR DEVICE

FIELD OF THE INVENTION

The present invention relates to a method for fabricating a semiconductor device, and more particularly, to a method for fabricating an inverter.

DESCRIPTION OF RELATED ARTS

Inverters have been widely used as a variable voltage or a variable frequency power converting device in recent industrial scenes. Inverter is well known as a type of a power converting device, converting a direct current into an alternating current through a high speed switching of a transistor device.

FIG. 1 illustrates an equivalent circuit of a typical inverter. A gate of a P-channel metal-oxide semiconductor (PMOS) transistor 101 and a gate of an N-channel metal-oxide semiconductor (NMOS) transistor 102 are connected to configure Vin 103, and a drain of the PMOS transistor 101 and a drain of the NMOS transistor 102 are connected to configure Vout 106. Vdd 104 is connected to a source of the PMOS transistor 101 and Vss 105 is connected to a source of the NMOS transistor 102.

FIG. 2 shows low drain current levels of a PMOS transistor (ID, $\mu A/\mu m$). Thus, when a PMOS transistor and an NMOS transistor configure a complementary metal-oxide semiconductor (CMOS) transistor, a line width of the PMOS transistor is often required to be increased such that the line width becomes appropriate for drain current characteristics of the PMOS and NMOS transistors.

However, uniformity of line widths may not be obtained when the line width of the PMOS transistor is increased due to the different line widths between the PMOS and the NMOS transistors.

Furthermore, a silicon (Si) crystalline structure of a semiconductor substrate may be altered from 100 to 110 during the fabrication to become appropriate for the drain current characteristics of the PMOS and NMOS transistors. Thus, high cost is resulted, generating economical limitations.

SUMMARY OF THE INVENTION

It is, therefore, an object of the present invention to provide a method for fabricating an inverter which can secure substantially the same drain currents of a PMOS transistor and an NMOS transistor.

In accordance with an aspect of the present invention, there is provided a semiconductor device, including: a P-channel metal-oxide semiconductor (PMOS) transistor and an N-channel metal-oxide semiconductor (NMOS) transistor formed in three or more fin active regions in a vertical stack structure; an input metal line contacting gates of the PMOS transistor and NMOS transistor; a power supply voltage metal line contacting four channel active regions of the PMOS transistor; a contact metal line contacting two channel active regions of the NMOS transistor; and an output metal line contacting four channel active regions of the PMOS transistor and the NMOS transistor.

In accordance with another aspect of the present invention, there is provided a method for fabricating a semiconductor device, including: forming a PMOS transistor and an NMOS transistor in three or more fin active regions in a vertical stack structure; contacting an input metal line to gates of the PMOS transistor and the NMOS transistor; contacting a power supply voltage metal line to four channel active regions of the PMOS transistor; contacting a contact metal line to two channel active regions of the NMOS transistor; and contacting an output metal line to four channel active regions of the PMOS and NMOS transistors.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

Figure 1:
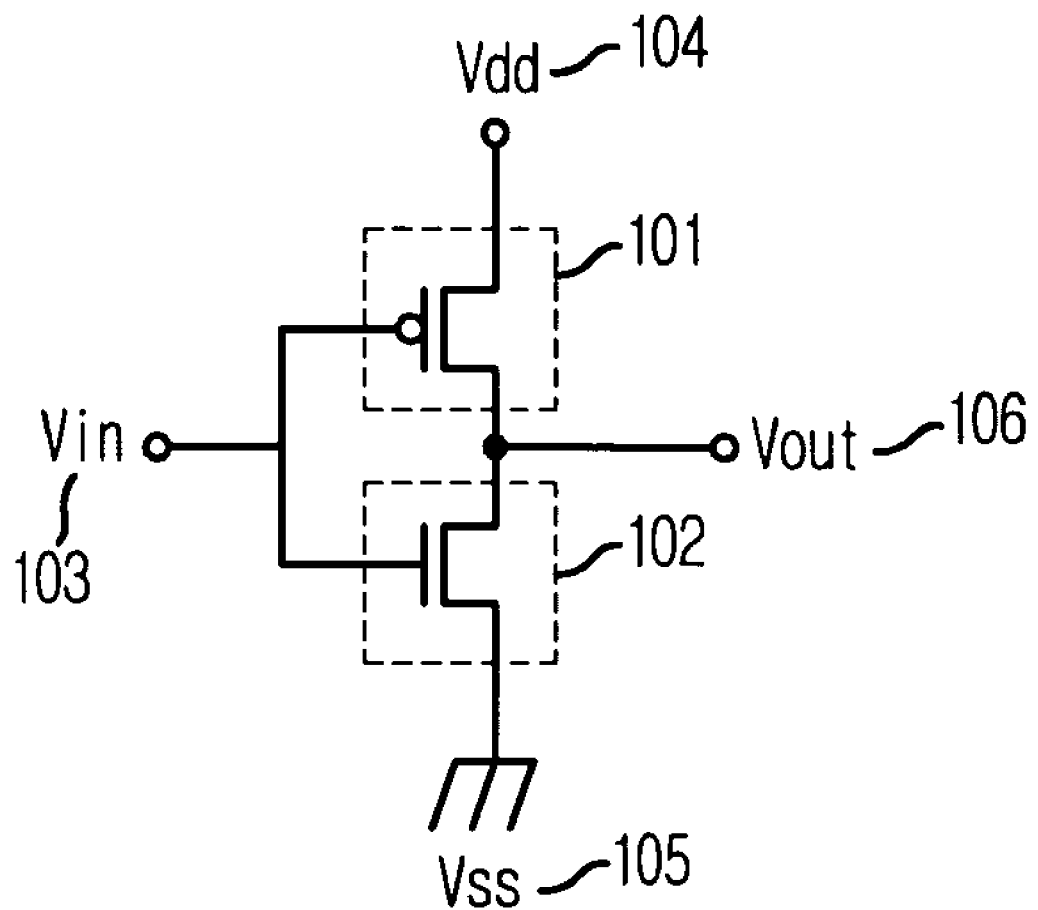
FIG. 1 illustrates an equivalent circuit of a typical inverter.
Figure 2:
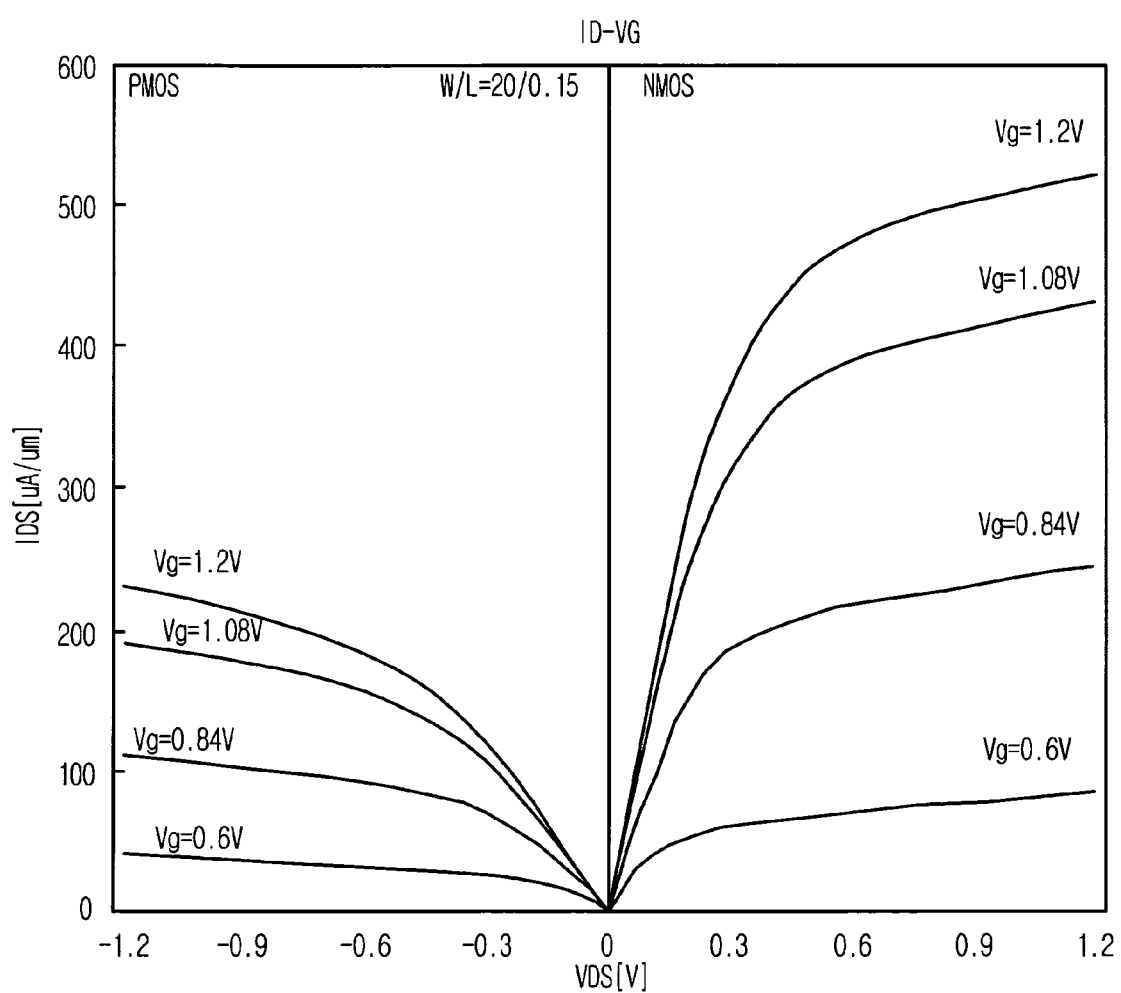
FIG. 2 illustrates a graph showing drain currents of a typical PMOS transistor and a typical NMOS transistor.

A semiconductor device and a method for fabricating the same in accordance with exemplary embodiments of the present invention will be described in detail with reference to the accompanying drawings. Furthermore, identical or like reference numerals through out the exemplary embodiments of the present invention represent identical or like elements in different drawings.

Figure 3:
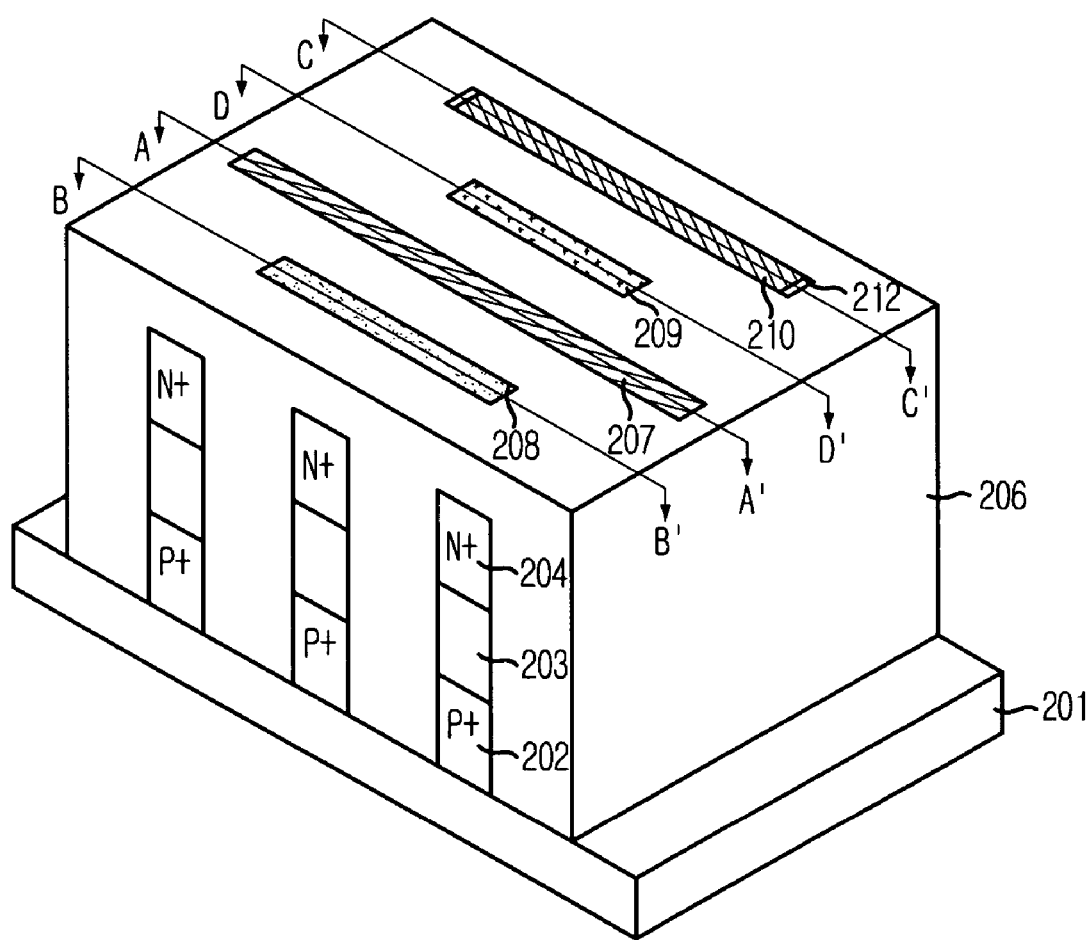
FIG. 3 illustrates a diagram of an inverter consistent with an embodiment of this invention.

FIG. 3 illustrates a diagram of an inverter consistent with an embodiment of this invention. A vertical stack structure including a first insulation layer 201, N-type substrates 202 for forming a P-channel metal-oxide semiconductor (PMOS) transistor, second insulation layers 203, and P-type substrates 204 for forming an N-channel metal-oxide semiconductor (NMOS) transistor is formed. A gate insulation layer and a gate conductive layer 207 are formed on sidewalls of the N-type substrates 202 and the P-type substrates 204.

An input metal line contacting gates of the N-type substrates 202 and the P-type substrates 204 is formed. An output metal line 208 contacting drains formed in four side portion surfaces of the N-type substrates 202 and the P-type substrates 204 is formed. A contact metal line 209 contacting a source formed in two side portion surfaces of the P-type substrates 204 is formed.

A power supply voltage metal line 210 contacting a source formed in four side portion surfaces of the N-type substrates 202 is formed. Sidewall insulation layers 212 are formed to avoid contact between the P-type substrates 204 and the power supply voltage metal line 210. Reference numeral 206 denotes a device isolation structure.

Figure 4:
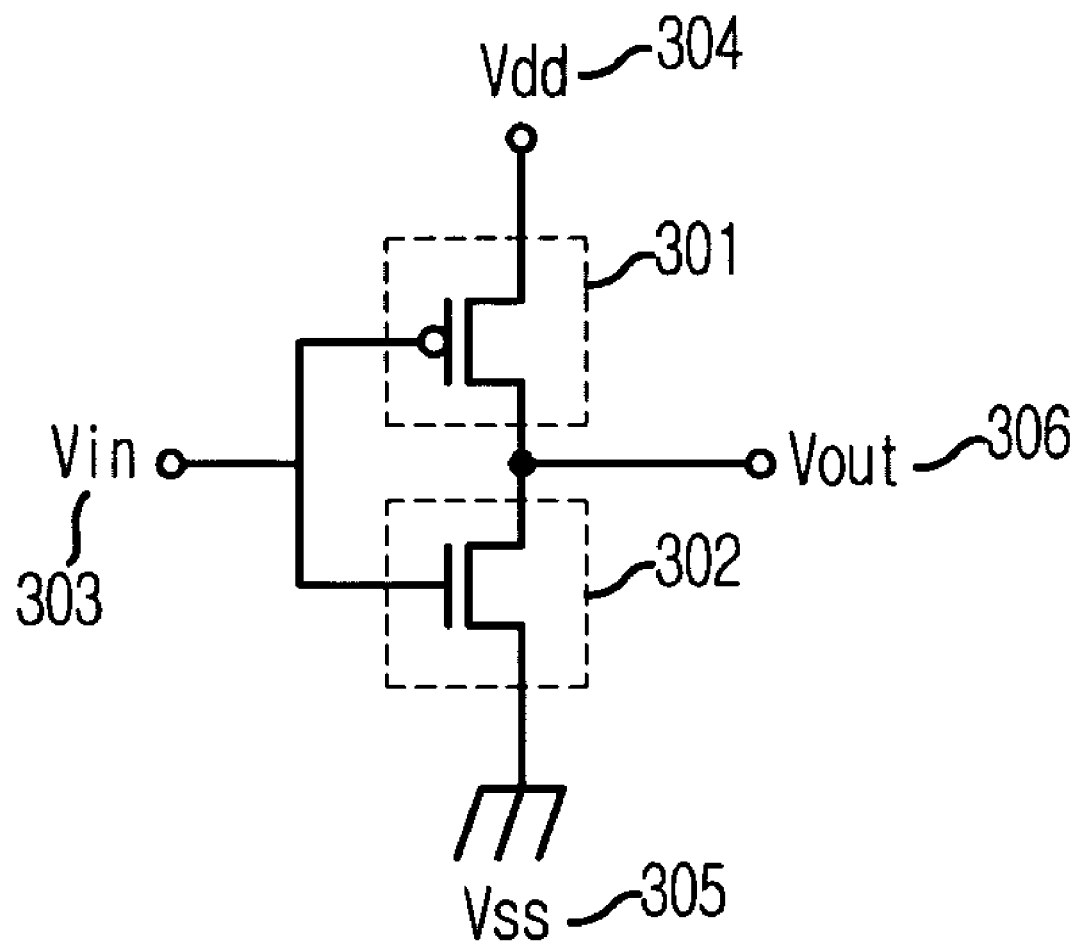
FIG. 4 illustrates an equivalent circuit of an inverter.

A comparison between FIGS. 3 and 4 shows that: a PMOS transistor 301 in FIG. 4 corresponds to the PMOS transistor in FIG. 3; an NMOS transistor 302 in FIG. 4 corresponds to the NMOS transistor in FIG. 3; a line of Vin 303 in FIG. 4 corresponds to the input metal line contacting the gates of the N-type substrates 202 and the P-type substrates 204 in FIG. 3; a line of Vdd 304 in FIG. 4 corresponds to the power supply voltage metal line 210 in FIG. 3; a line of Vss 305 in FIG. 4 corresponds to the contact metal line 209 in FIG. 3; and a line of Vout 306 in FIG. 4 corresponds to the output metal line 208 in FIG. 3.

Figure 5A:
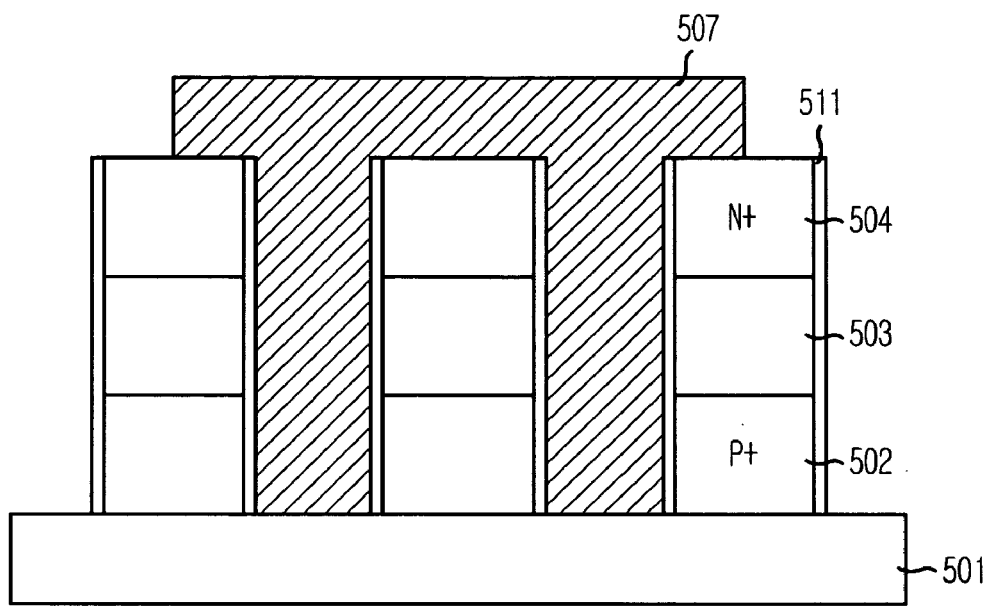
FIGS. 5A and 5B illustrate cross-sectional views to describe a fabrication process of an inverter consistent with an embodiment of this invention, particularly, a method for fabricating a PMOS transistor and an NMOS transistor.
Figure 5B:
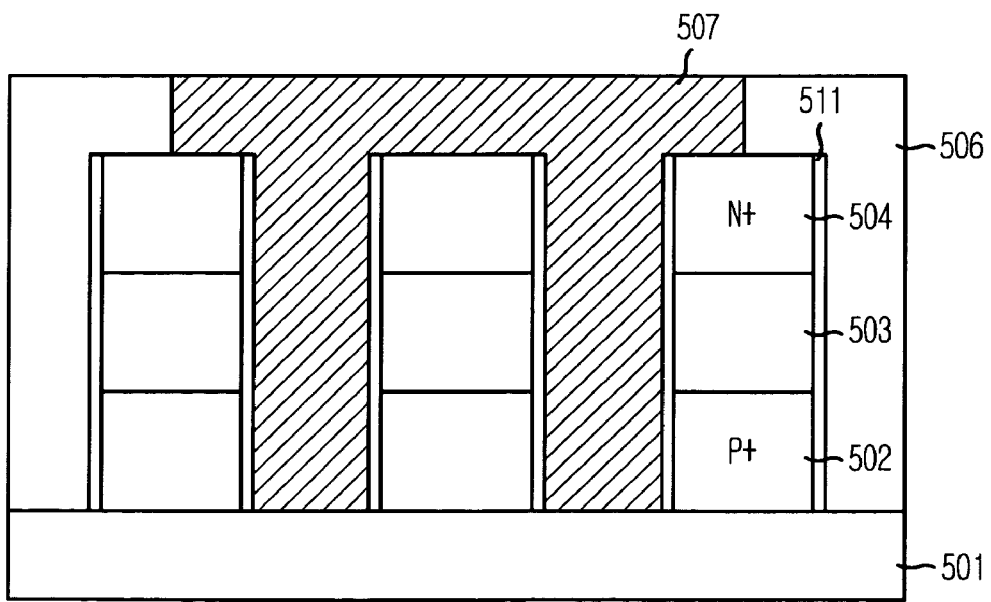

FIGS. 5A and 5B illustrate cross-sectional views of the vertical stack structure shown in FIG. 3 cut along a line A-A' to describe a fabrication process of an inverter consistent with an embodiment of this invention, particularly, a method for fabricating a PMOS transistor and an NMOS transistor.

Referring to FIG. 5A, a silicon-on-insulator (SOI) substrate is selectively etched to form at least three fin active regions. Each fin active region includes a first insulation layer 501, an N-type substrate 502 for forming a PMOS transistor, a second insulation layer 503, and a P-type substrate 504 for forming an NMOS transistor.

Gate insulation layers 511 are formed on both sidewalls of each fin active region. A gate conductive layer 507 is formed to cover four side portion surfaces of the fin active regions.

Referring to FIG. 5B, a device isolation layer is formed over the resultant substrate structure. The device isolation layer covers the gate conductive layer 507. A chemical mechanical polishing (CMP) process is performed onto the device isolation layer to form a device isolation structure 506, exposing a top surface of the gate conductive layer 507.

The N-type substrates 502 are doped with P-type impurities to form a source and a drain of the PMOS transistor, and the P-type substrates 504 are doped with N-type impurities to form a source and a drain of the NMOS transistor.

Figure 6A:
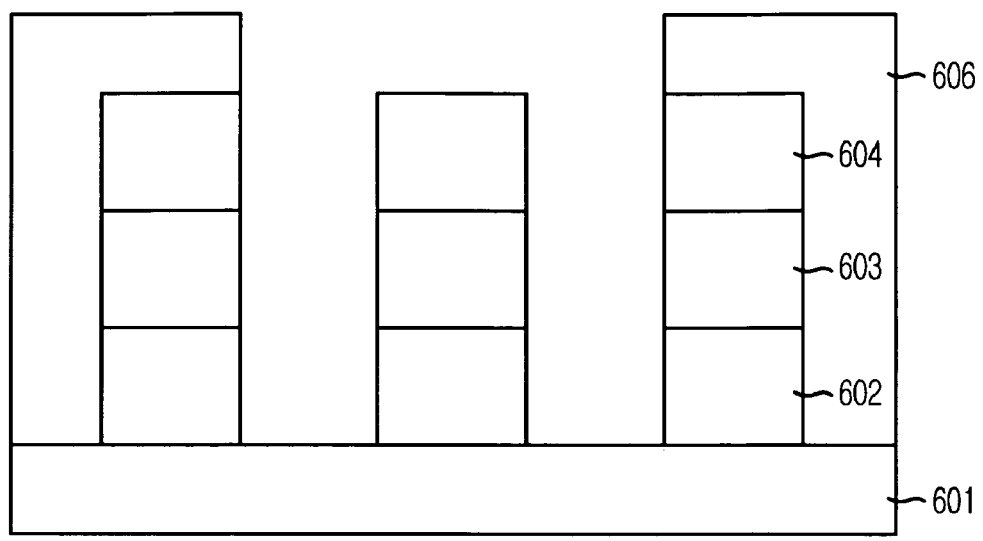
FIGS. 6A and 6B illustrate cross-sectional views to describe a fabrication process of an inverter consistent with an embodiment of this invention, particularly, a method for fabricating an output metal line.
Figure 6B:
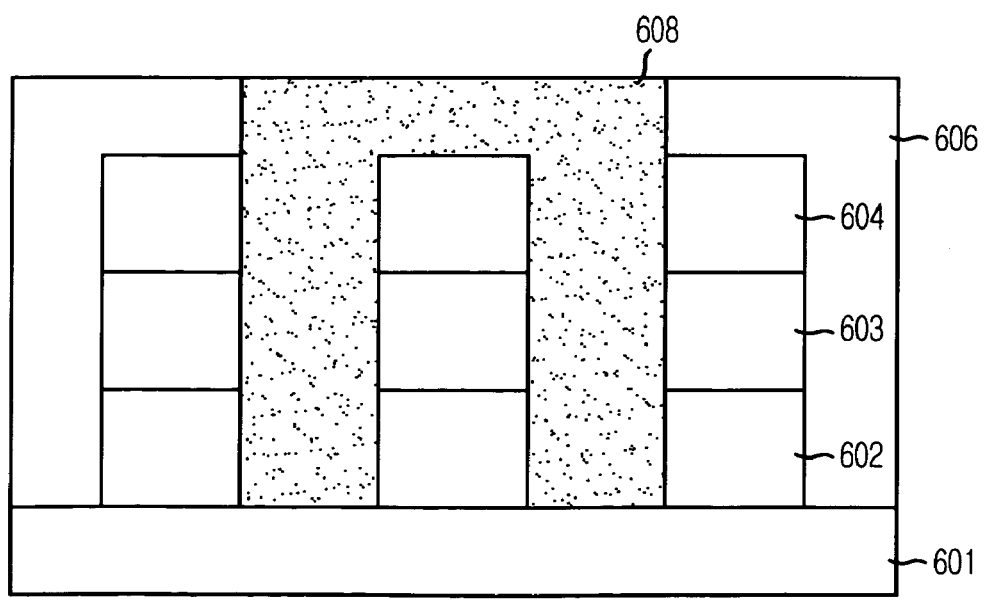

FIGS. 6A and 6B illustrate cross-sectional views of the vertical stack structure shown in FIG. 3 cut along a line B-B' to describe a fabrication process of an inverter consistent with an embodiment of this invention, particularly, a method for fabricating an output metal line.

Referring to FIG. 6A, a silicon-on-insulator (SOI) substrate is selectively etched to form at least three fin active regions. Each fin active region includes a first insulation layer 601, an N-type substrate 602 for forming a PMOS transistor, a second insulation layer 603, and a P-type substrate 604 for forming an NMOS transistor. Then, the PMOS transistor and the NMOS transistor are formed as described in FIGS. 5A and 5B. A device isolation layer is formed and selectively etched to form a device isolation structure 606, exposing four side portion surfaces of the fin active regions. A drain is formed in the four side portion surfaces by doping impurities, and thus, the four side portion surfaces become channel active regions. An individual channel active region corresponds to one side portion surface of the fin active regions.

Referring to FIG. 6B, an output metal line 608 is formed over the exposed fin active regions. The output metal line 608 may include a tungsten layer formed by employing a chemical vapor deposition (CVD) method.

Figure 7A:
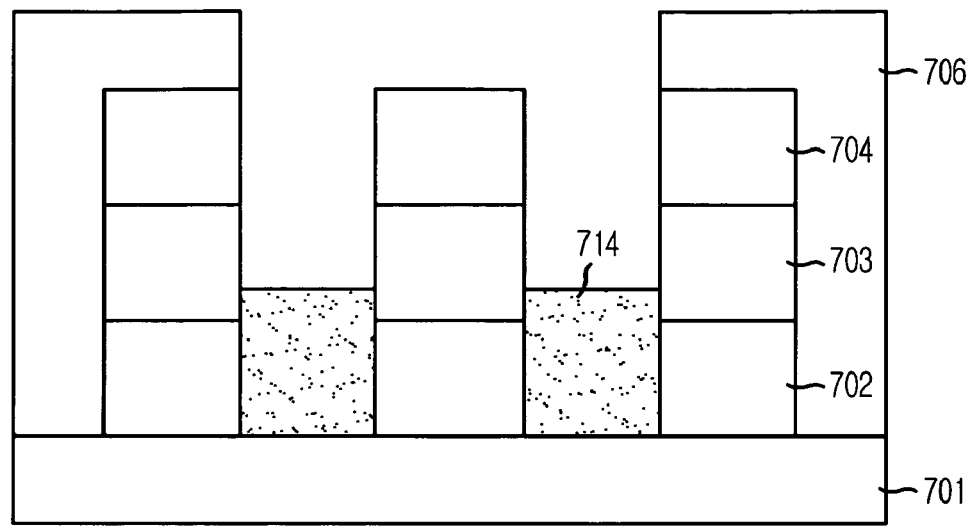
FIGS. 7A to 7C illustrate cross-sectional views to describe a fabrication process of an inverter consistent with an embodiment of this invention, particularly, a method for fabricating a power supply voltage metal line.
Figure 7B:
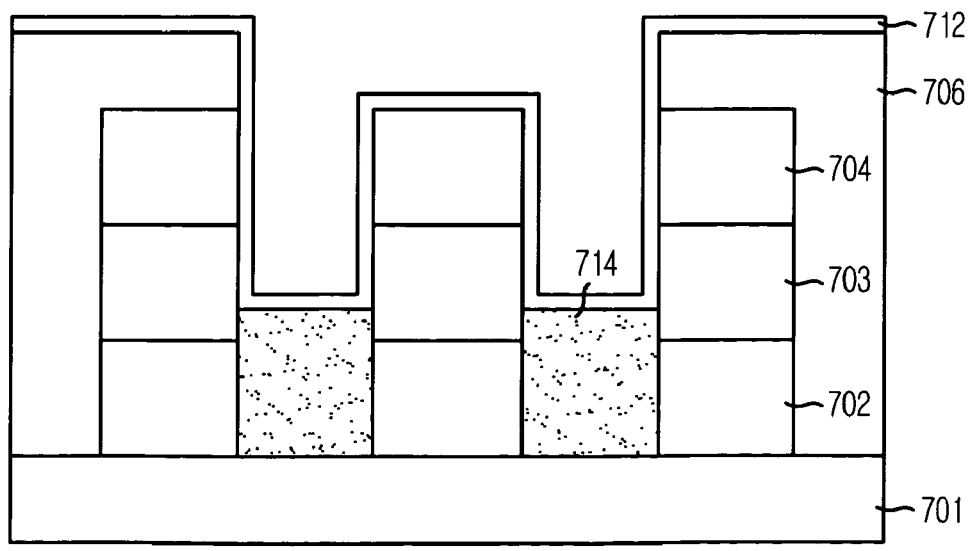
Figure 7C:
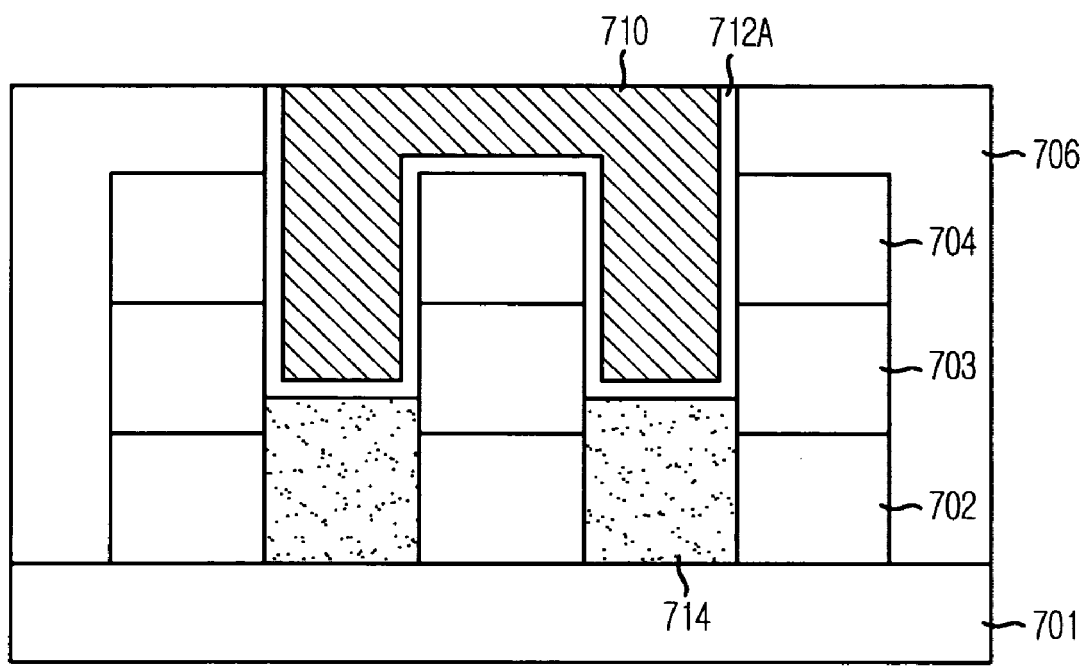

FIGS. 7A to 7C illustrate cross-sectional views of the vertical stack structure shown in FIG. 3 cut along a line C-C' to describe a fabrication process of an inverter consistent with an embodiment of this invention, particularly, a method for fabricating a power supply voltage metal line.

Referring to FIG. 7A, a silicon-on-insulator (SOI) substrate is selectively etched to form at least three fin active regions. Each fin active region includes a first insulation layer 701, an N-type substrate 702 for forming a PMOS transistor, a second insulation layer 703, and a P-type substrate 704 for forming an NMOS transistor. Then, the PMOS transistor and the NMOS transistor are formed as described in FIGS. 5A and 5B. A device isolation layer is formed and selectively etched to form a device isolation structure 706, exposing four side portion surfaces of the fin active regions.

Pad metal layers 714 contacting the N-type substrates 702 of the SOI substrate are formed. The pad metal layers 714 may be simultaneously formed with the output metal line formed in FIG. 6B. That is, the pad metal layers 714 and the output metal line are formed by performing substantially the same process using substantially the same material.

Referring to FIG. 7B, a sidewall insulation material layer 712 is formed over the resultant substrate structure to avoid contact between the P-type substrates 704 and a subsequent power supply voltage metal line. The sidewall insulation material layer 712 may include a nitride-based layer having a thickness ranging from approximately 100 Å to approximately 200 Å, formed by employing a low pressure chemical vapor deposition (LPCVD) method.

Referring to FIG. 7C, a CMP process is performed to remove portions of the sidewall insulation material layer 712 formed over the device isolation device 706, and an etching process is performed to remove portions of the sidewall insulation material layer 712 formed over the pad metal layers 714, thereby forming sidewall insulation layers 712A.

A power supply voltage metal line 710 contacting the pad metal layers 714 is formed. The power supply voltage metal line 710 contacts a source of the PMOS transistor formed in the N-type substrates 702.

Figure 8A:
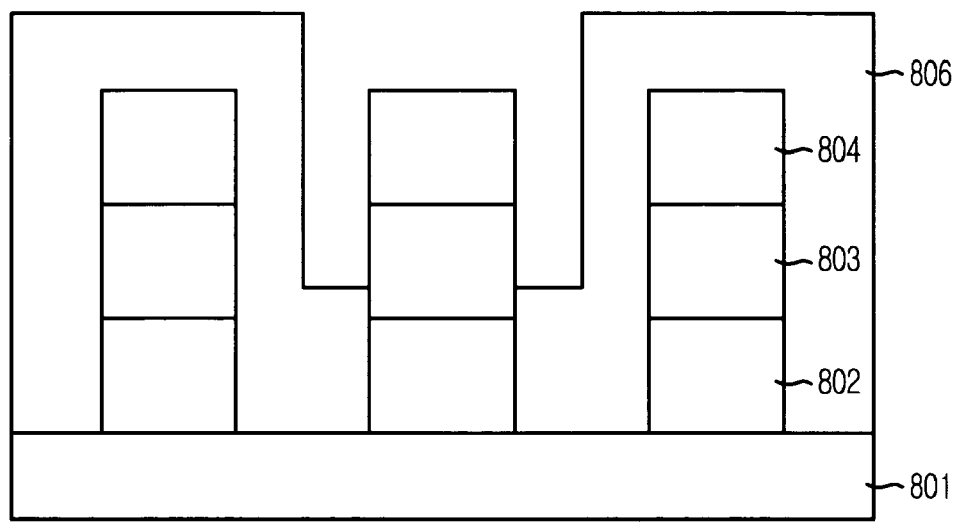
FIGS. 8A and 8B illustrate cross-sectional views to describe a fabrication process of an inverter consistent with an embodiment of this invention, particularly, a method for fabricating a contact metal line.
Figure 8B:
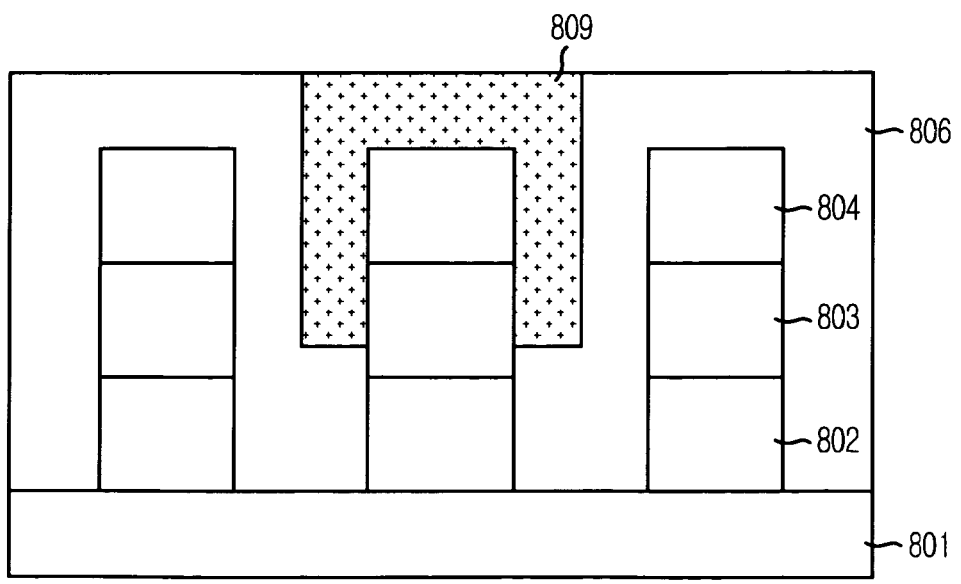

FIGS. 8A and 8B illustrate cross-sectional views of the vertical stack structure shown in FIG. 3 cut along a line D-D' to describe a fabrication process of an inverter consistent with an embodiment of this invention, particularly, a method for fabricating a contact metal line.

Referring to FIG. 8A, a silicon-on-insulator (SOI) substrate is selectively etched to form at least three fin active regions. Each fin active region includes a first insulation layer 801, an N-type substrate 802 for forming a PMOS transistor, a second insulation layer 803, and a P-type substrate 804 for forming an NMOS transistor. Then, the PMOS transistor and the NMOS transistor are formed as described in FIGS. 5A and 5B. A device isolation layer is formed over the resultant substrate structure and selectively etched to form a device isolation structure 806, exposing two side portion surfaces of the fin active regions. Only the P-type substrate 804 of the fin active region is exposed. Thus, a source of the NMOS transistor formed in the P-type substrate 804 is exposed.

Referring to FIG. 8B, a contact metal line 809 is formed to contact the source of the NMOS transistor formed in the two exposed side portion surfaces.

Consistent with the embodiment, the fin active regions are formed on the SOI substrate, and the vertical stack structure including the fin active regions, the PMOS transistor, and the NMOS transistor is formed. The number of the channel active regions is differentiated to unify drain currents of the PMOS and NMOS transistors. That is, the PMOS transistor obtains the channel active regions of four side portion surfaces, and the NMOS transistor obtains the channel active regions of two side portion surfaces. An individual channel active region corresponds to a side portion surface of a fin active region. The metal lines include a tungsten layer, and are formed by employing a CVD method using a typical equivalent circuit.

The size of line widths can be unified by differentiating the number of the channel active regions of the PMOS and the NMOS transistors. Furthermore, economical limitations may be resolved by using the typical SOI substrate.

Accordingly, the drain currents of the PMOS and NMOS transistors can be unified into substantially the same values.

Furthermore, limitations related to the typical economical difficulties and the difference between the line widths of the PMOS/NMOS transistors may be resolved.

The present application contains subject matter related to the Korean patent application No. KR 2005-0091693, filed in the Korean Patent Office on Sep. 29, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A semiconductor device, comprising:
    a P-channel metal-oxide semiconductor (PMOS) transistor and an N-channel metal-oxide semiconductor (NMOS) transistor formed in three or more fin active regions in a vertical stack structure, each fin active region having a silicon-on-insulator (SOI) substrate including a first insulation layer, an N-type substrate, a second insulation layer, and a P-type substrate;
    an input metal line contacting gates of the PMOS transistor and NMOS transistor;
    a power supply voltage metal line contacting four channel active regions of the PMOS transistor;
    a contact metal line contacting two channel active regions of the NMOS transistor; and
    an output metal line contacting four channel active regions of the PMOS transistor and the NMOS transistor.

2. The semiconductor device of claim 1, wherein each channel active region comprises a side portion surface of the fin active region.

3. The semiconductor device of claim 1, wherein the PMOS transistor and the NMOS transistor comprise in cross-section:
    the fin active regions having the SOI substrate including the first insulation layer, the N-type substrate, the second insulation layer, and the P-type substrate formed in sequential order;
    gate insulation layers formed on both sides of the fin active regions;
    a gate conductive layer covering four channel active regions of the fin active regions; and
    a P-type source and a drain formed in the N-type substrate and an N-type source and a drain formed in the P-type substrate.

4. The semiconductor device of claim 1, wherein the power supply voltage metal line comprises in cross-section:
    the PMOS transistor and the NMOS transistor formed in the fin active regions in the vertical stack structure;
    pad metal layers contacting sources formed in four side portion surfaces of the PMOS transistor;
    sidewall insulation layers formed over sources formed in side portion surfaces of the NMOS transistor; and
    the power supply voltage metal line contacting the pad metal layers.

5. The semiconductor device of claim 4, wherein the sidewall insulation layers are formed using a low pressure chemical vapor deposition (LPCVD) method to obtain a thickness ranging from approximately 100 Å to approximately 200 Å.

6. The semiconductor device of claim 1, wherein the contact metal line comprises in cross-section:
    the PMOS transistor and the NMOS transistor formed in the fin active regions in the vertical stack structure; and
    the contact metal line contacting sources formed in two side portion surfaces of the NMOS transistor.

7. The semiconductor device of claim 1, wherein the output metal line comprises in cross-section:
    the PMOS transistor and the NMOS transistor formed in the fin active regions in the vertical stack structure; and
    the output metal line contacting drains formed in four side portion surfaces of the PMOS and NMOS transistors.

8. The semiconductor device of claim 1, wherein the metal lines comprise a tungsten layer formed by employing a chemical vapor deposition (CVD) method.

* * * * *